(12) United States Patent
Hwang et al.

(10) Patent No.: US 7,910,998 B2
(45) Date of Patent: Mar. 22, 2011

(54) SILICON CONTROLLED RECTIFIER DEVICE FOR ELECTROSTATIC DISCHARGE PROTECTION

(75) Inventors: Hsin-Yen Hwang, Hsinchu County (TW); Tien-Hao Tang, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 39 days.

(21) Appl. No.: 11/776,538

(22) Filed: Jul. 11, 2007

(65) Prior Publication Data

US 2009/0014800 A1    Jan. 15, 2009

(51) Int. Cl.
*H01L 23/62* (2006.01)
(52) U.S. Cl. ............................. 257/355; 257/E29.166
(58) Field of Classification Search .................. 257/355, 257/E29.166
See application file for complete search history.

(56) References Cited

U.S. PATENT DOCUMENTS

| 5,780,899 | A | * | 7/1998 | Hu et al. | 257/335 |
| 6,765,771 | B2 | * | 7/2004 | Ker et al. | 361/56 |
| 2006/0226488 | A1 | * | 10/2006 | Schneider et al. | 257/362 |
| 2007/0010077 | A1 | * | 1/2007 | Riess et al. | 438/548 |
| 2007/0023866 | A1 | * | 2/2007 | Chatty et al. | 257/575 |
| 2008/0179624 | A1 | * | 7/2008 | Russ et al. | 257/173 |

* cited by examiner

*Primary Examiner* — Thanh V Pham
*Assistant Examiner* — Marvin Payen
(74) *Attorney, Agent, or Firm* — Winston Hsu; Scott Margo

(57) ABSTRACT

An SCR device includes a substrate, a plurality of isolation structures defining a first region and a second region in the substrate, an n well disposed in the substrate, an n type first doped region disposed in the first region in the substrate, a p type second doped region disposed in the second region in the substrate, and a p type third doped region (PESD implant region) disposed underneath the first doped region in the first region in the substrate. The well is disposed underneath the first region and the second region, and the third doped region isolates the first doped region from the well.

19 Claims, 21 Drawing Sheets

SILICON CONTROLLED RECTIFIER DEVICE FOR ELECTROSTATIC DISCHARGE PROTECTION

BACKGROUND OF THE INVENTION

1. Field of the Invention

The present invention relates to an electrostatic discharge (ESD) protection device, and more particularly, to a silicon controlled rectifier (SCR) device for ESD protection.

2. Description of the Prior Art

For integrated circuits, ESD damage is a critical issue, and many types of ESD protection devices such as diode, MOS transistor, bipolar transistor, and SCR device have been proposed to deal with ESD damage. When an ESD pulse occurs, the ESD protection device needs to be turned on in advance and grounding the ESD current so that the internal circuits to be protected are not damaged. Among various ESD protection devices, SCR device has been broadly used because of its low holding voltage in comparison with other ESD protection devices.

Please refer to FIG. 1. FIG. 1 is a schematic diagram of a conventional lateral silicon controlled rectifier (LSCR) device. As shown in FIG. 1, the LSCR device includes a p type substrate 10, a first n+ doped region 12 formed in the substrate 10, a p+ doped region 14 formed in the substrate 10, a second n+ doped region 16 formed in the substrate 10, and an n well 18 disposed underneath the first n+ doped region 12 and the p+ doped region 14. The first n+ doped region 12, the p+ doped region 14, and the second n+ doped region 16 are arranged laterally in the substrate 10 and isolated form each other by shallow trench isolations 20. The first n+ doped region 12 and the p+ doped region 14 are electrically connected to an anode 22, and the second n+ doped region 16 is electrically connected to a cathode 24.

When the LSCR is triggered, the ESD current flows through the p+doped region 14, the n well 18, the P type substrate 10, the second n+ doped region 16, and then to ground. However, the trigger voltage of this type of conventional LSCR device is normally greater than 10V, which is too high to protect the internal circuit in many applications.

Please refer to FIG. 2. FIG. 2 is a schematic diagram of another conventional LSCR device. As shown in FIG. 2, the LSCR device includes a p type substrate 30, a first n+ doped region 32 formed in the substrate 30, a p+ doped region 34 formed in the substrate 30, a second n+ doped region 36 formed in the substrate 30, a third n+ doped region 38 formed in the substrate 30, and an n well 40 disposed in the substrate 30. The first n+ doped region 32, the p+ doped region 34, the second n+ doped region 36, and the third n+ doped region 38 are arranged laterally in the substrate 30 and isolated form each other by shallow trench isolations 42. The first n+ doped region 32 and the p+ doped region 34 are electrically connected to an anode 44, and the third n+ doped region 38 is electrically connected to a cathode 46. This type of LSCR device normally has a trigger voltage of 6 to 10 voltage, which is still too high to protect the internal circuit in many applications.

Please refer to FIG. 3. FIG. 3 is a schematic diagram of still another conventional LSCR device. As shown in FIG. 3, the LSCR device includes a p type substrate 50, a first n+ doped region 52 formed in the substrate 50, a p+ doped region 54 formed in the substrate 50, a second n+ doped region 56 formed in the substrate 50, a third n+ doped region 58 formed in the substrate 60, and an n well 60 in the substrate 50. The first n+ doped region 52, the p+ doped region 54, and the second n+ doped region 56 are arranged laterally in the substrate 50 and isolated form each other by shallow trench isolations 62. This type of SCR device has a gate structure 64 disposed on the surface of the substrate 50 between the second n+ doped region 56 and the third n+ doped region 58. The first n+ doped region 52 and the p+ doped region 54 are electrically connected to an anode 66, and the third n+ doped region 58 and the gate structure 64 are electrically connected to a cathode 68. The gate structure 64 is used to decrease the trigger voltage, providing the SCR device a trigger voltage of about 6 V. However, the trigger voltage has it limit, and this type of LSCR device requires more layout area, which is not desirable in IC design and fabrication.

As the requirement for ICs with lower supply voltage and high performance increases, an ESD protection device of lower trigger voltage without increasing the layout area is eagerly desirable.

SUMMARY OF THE INVENTION

It is therefore one of the objectives of the claimed invention to provide an SCR device for ESD protection to improve the ESD protection ability.

According to an embodiment of the present invention, an SCR device for ESD protection is provided. The SCR device includes a substrate, a plurality of isolation structures defining a first region and a second region in the substrate, a well of a first conductive type disposed in the substrate, a first doped region of the first conductive type disposed in the first region in the substrate, a second doped region of a second conductive type disposed in the second region in the substrate, and a third doped region of the second conductive type disposed underneath the first doped region in the first region in the substrate. The well is disposed underneath the first region and the second region, and the third doped region isolates the first doped region from the well.

According to another embodiment of the present invention, an SCR device for ESD protection is provided. The SCR device for ESD protection includes a substrate, a plurality of isolation structures disposed in the substrate, a gate structure disposed on the surface of the substrate, a well of a first conductive type disposed in the substrate, a first doped region of the first conductive type disposed in a first region in the substrate, a second doped region of a second conductive type disposed in a second region in the substrate, a third doped region of the second conductive type disposed underneath the first doped region in the first region in the substrate, and a fourth doped region of the second conductive type disposed alongside the first doped region. The well is disposed underneath the first region and the second region, and the third doped region and the fourth doped region isolate the first doped region from the well.

The trigger voltage of the SCR device of the present invention is advantageous for its reduced trigger voltage, small layout area, and standard process compatibility.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
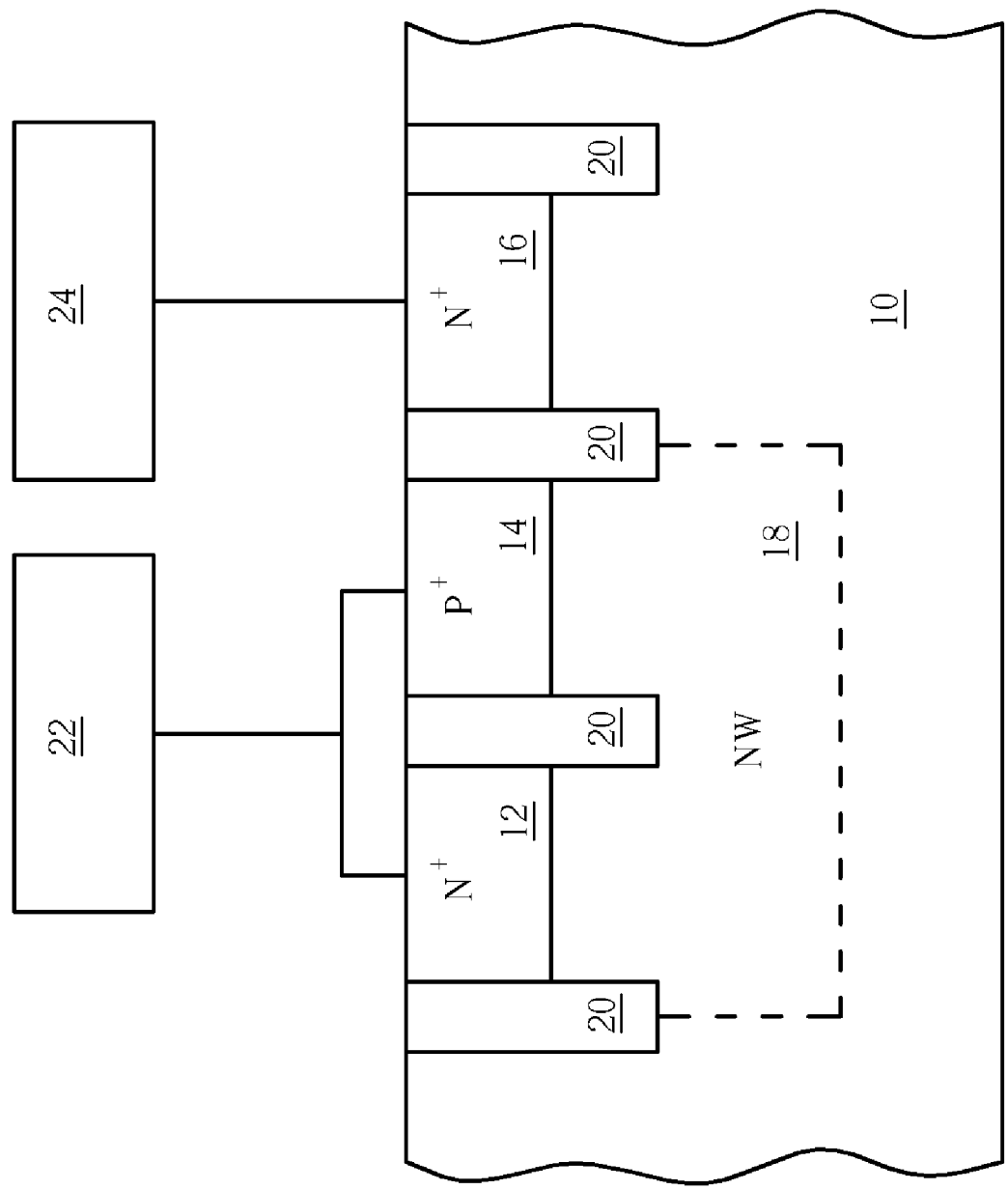
FIG. 1 is a schematic diagram of a conventional LSCR device.
Figure 2:
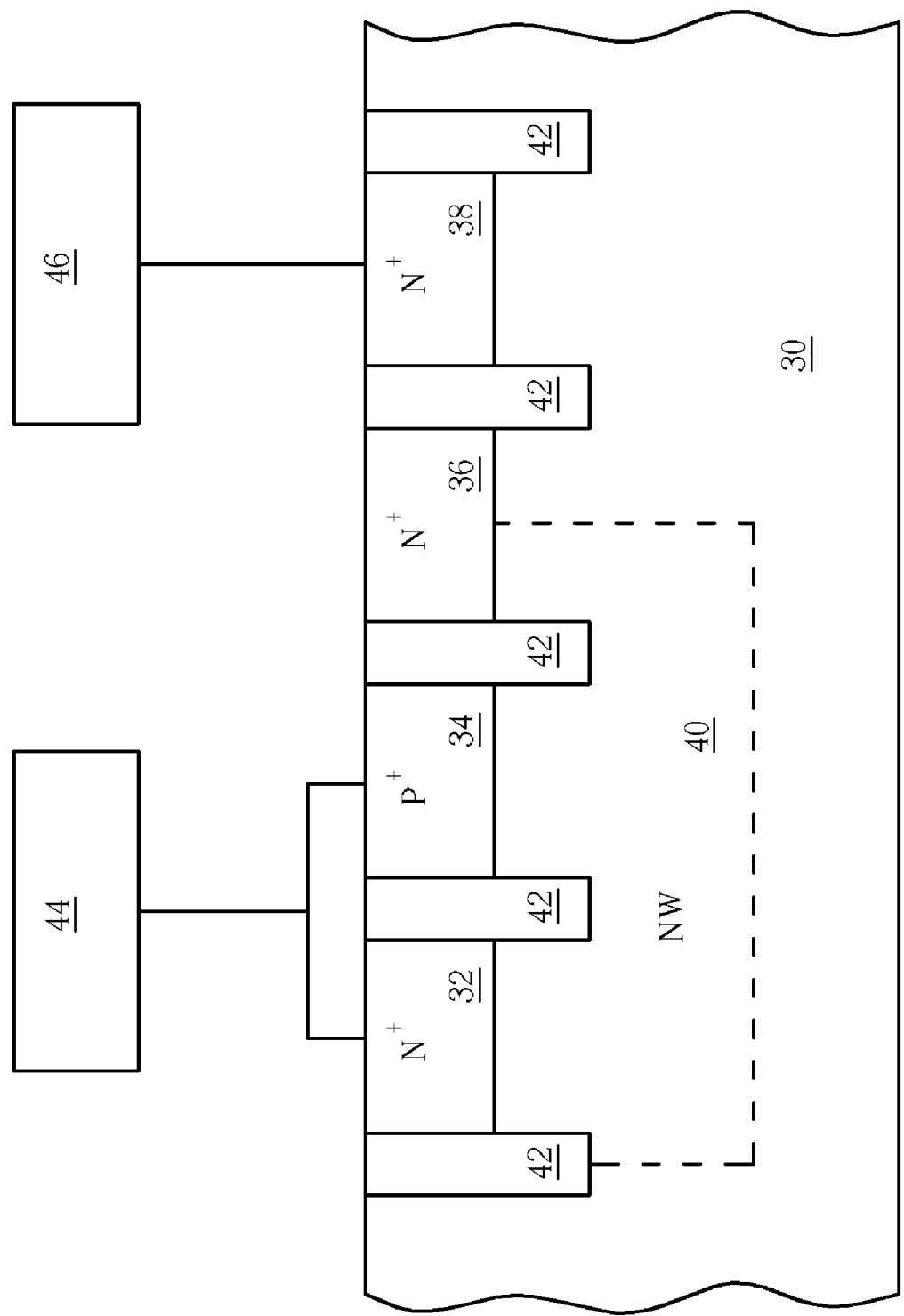
FIG. 2 is a schematic diagram of another conventional LSCR device.
Figure 3:
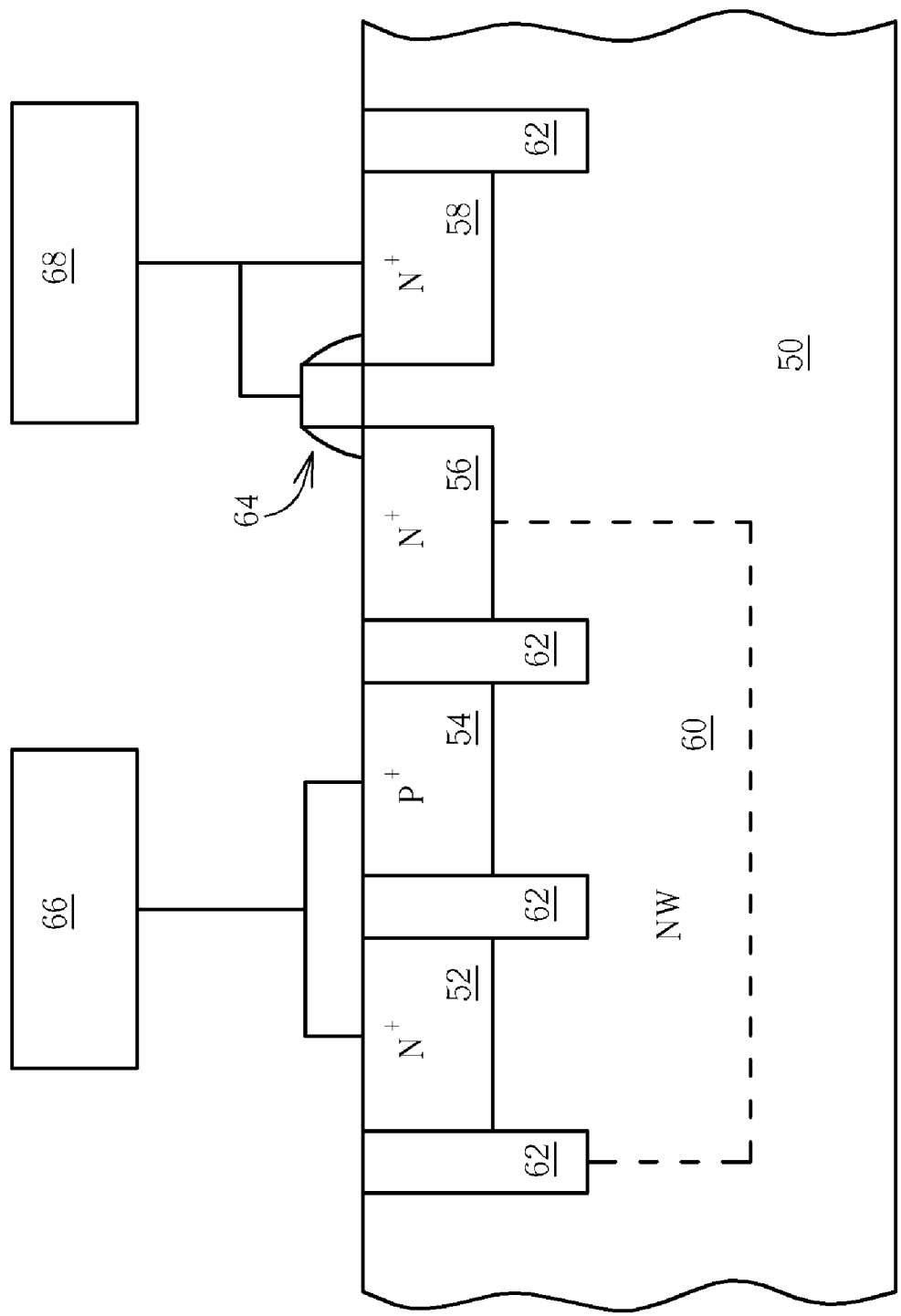
FIG. 3 is a schematic diagram of still another conventional LSCR device.
Figure 4:
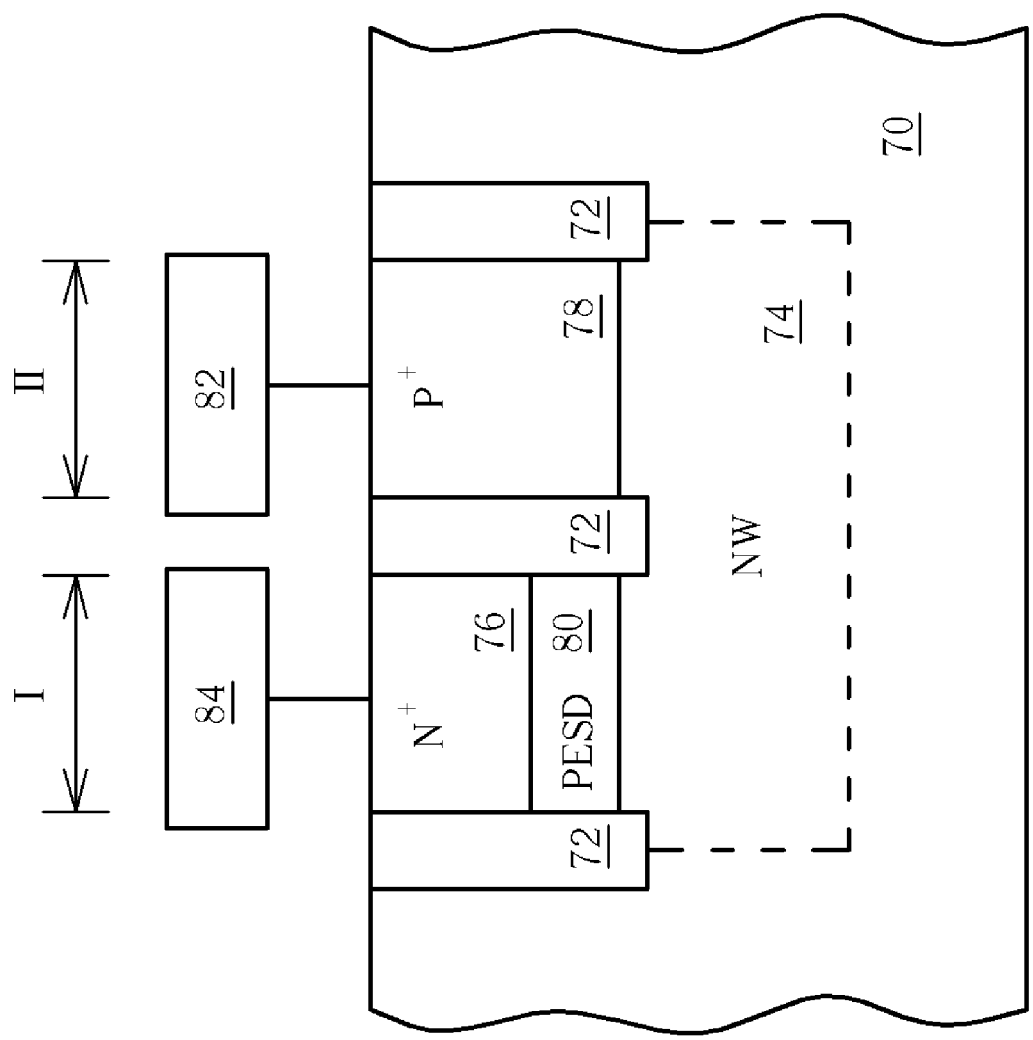
FIG. 4 is a schematic diagram illustrating an SCR device for ESD protection according to an embodiment of the present invention.

Please refer to FIG. 4. FIG. 4 is a schematic diagram illustrating an SCR device for ESD protection according to an embodiment of the present invention. It is to be appreciated that in the following embodiments the first conductive type is n type and the second conductive type is p type, however, the first conducive type and the second conductive type can be swapped in other embodiments. As shown in FIG. 4, the SCR device for ESD protection includes a substrate 70 of the second conductive type, a plurality of isolation structures 72 e.g. STIs defining a first region I and a second region II in the substrate 70, a well 74 of the first conductive type disposed in the substrate 70 underneath the first region I and the second region II, a first doped region 76 of the first conductive type disposed in the first region I in the substrate 70, a second doped region 78 of a second conductive type disposed in the second region II in the substrate 70, and a third doped region 80 of the second conductive type disposed underneath the first doped region 76 in the first region I in the substrate 70.

The first doped region 76, the second doped region 78, and the third doped region 80 are heavily doped. The SCR device further includes an anode 82 electrically connected to the second doped region 78, and a cathode 84 electrically connected to the first doped region 76.

In this embodiment, the well 74 surrounds the bottom of the third doped region 80. In other words, the whole third doped region 80 is disposed over the well 74, so that the third doped region 80 is not coupled to the substrate 70.

Figure 5:
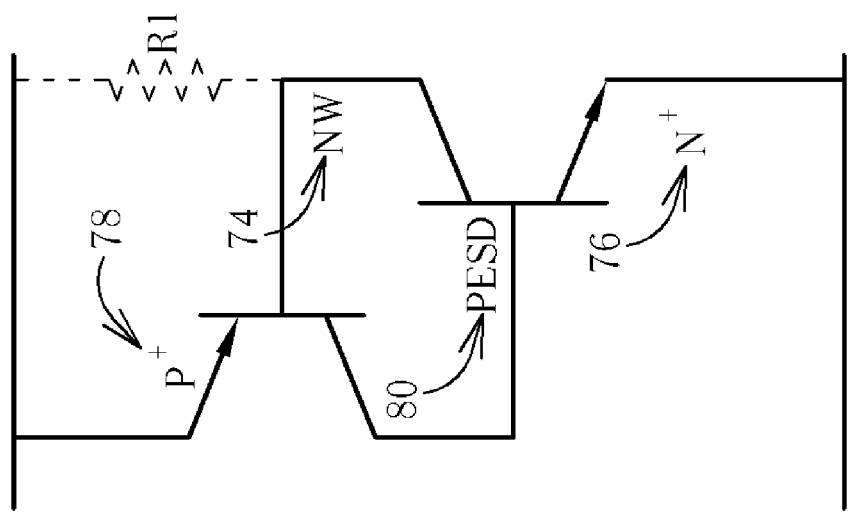
FIG. 5 depicts an equivalent circuit of the SCR device shown in FIG. 4.
Figure 6:
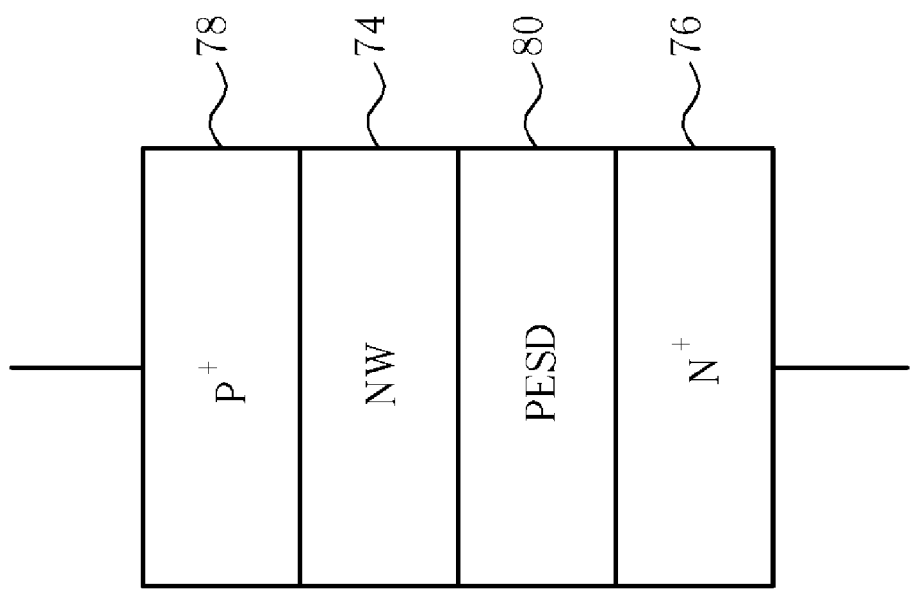
FIG. 6 depicts a pnpn structure in the SCR device.

Please refer to FIGS. 5-6 along with FIG. 4. FIG. 5 depicts an equivalent circuit of the SCR device shown in FIG. 4, and FIG. 6 depicts a pnpn structure in the SCR device. As shown in FIGS. 4-5, the p type second doped region 78, the n well 74, and the p type third doped region 80 form a pnp bipolar transistor; the n well 74, the p type third doped region 80, and the n type first doped region 76 form an npn bipolar transistor. The pnp bipolar transistor and the npn bipolar transistor form a pnpn structure as shown in FIG. 6. It is appreciated that the n well 74 may be optionally electrically coupled to a VDD wherever necessary, thereby forming a resistor R1 (shown by dotted line) which represents the resistance between the VDD and the n well 74.

The SCR device of this embodiment uses the p type third doped region 80, which is also referred to as PESD implant region, to adjust the trigger voltage and holding voltage. The third doped region 80 is disposed underneath the first doped region 76, and thus adding the third doped region 80 does not affect the layout area of the SCR device at all. By altering the parameters of the third doped region 80 e.g. the doped concentration, the dimension or the thickness of the third doped region 80, the trigger voltage and holding voltage of the SCR device can be adjusted correspondingly. For instance, if the thickness of the third doped region 80 becomes thinner, the beta ($\beta$) gain gets larger. This makes the npn bipolar transistor can be turned on more quickly, thereby reducing the trigger voltage.

Figure 7:
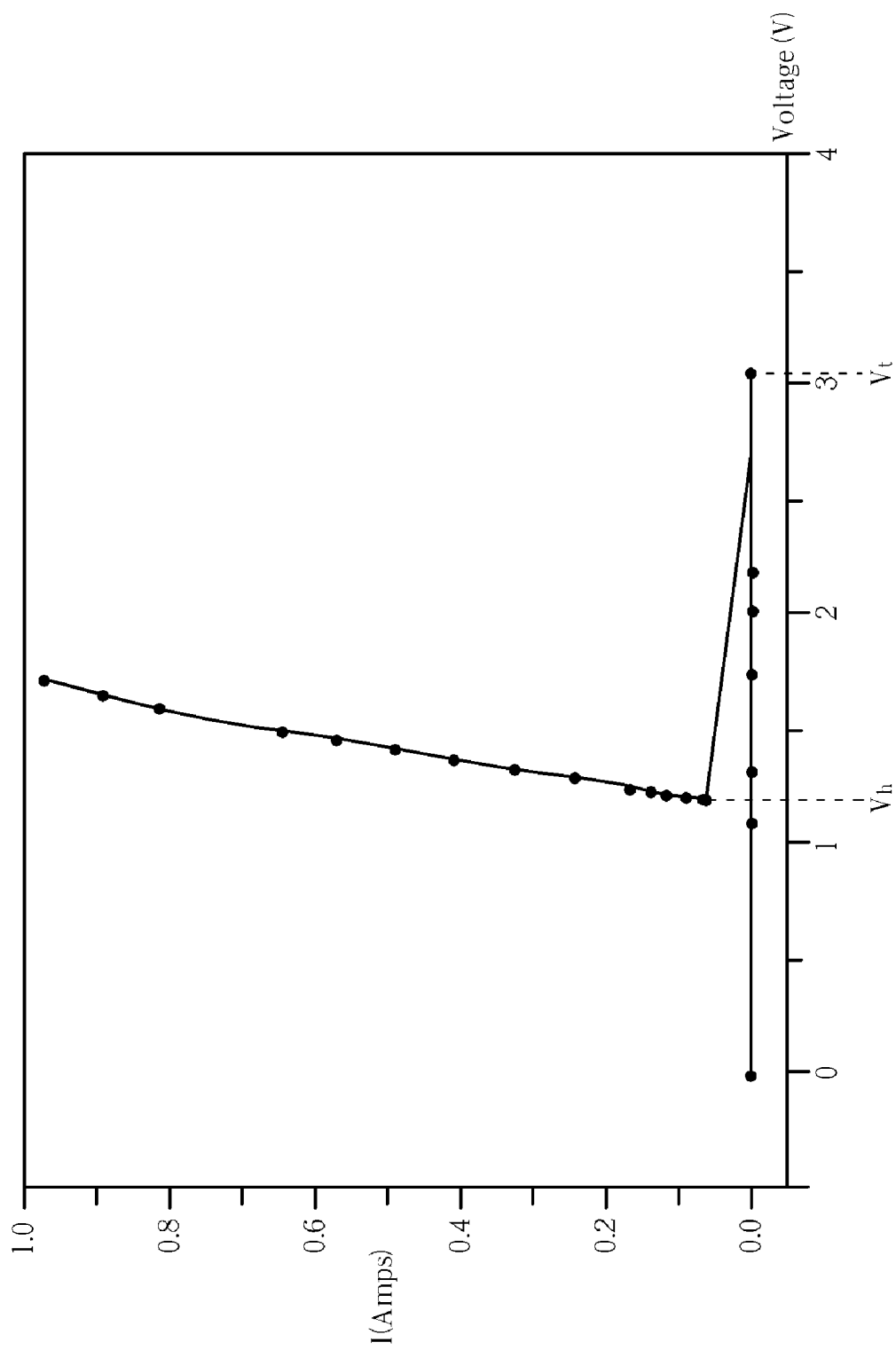
FIG. 7 illustrates an I-V curve of the SCR device shown in FIG. 4.

Please refer to FIG. 7. FIG. 7 illustrates an I-V (current vs. voltage) curve of the SCR device shown in FIG. 4. As shown in FIG. 7, the SCR device of the present invention substantially has a trigger voltage ($V_t$) of 3 V, and a holding voltage ($V_h$) of 1.2 V in this embodiment. Of course, the trigger voltage and the holding voltage can be tuned by altering the dimension, thickness or the doped concentration of the third doped region.

Figure 8:
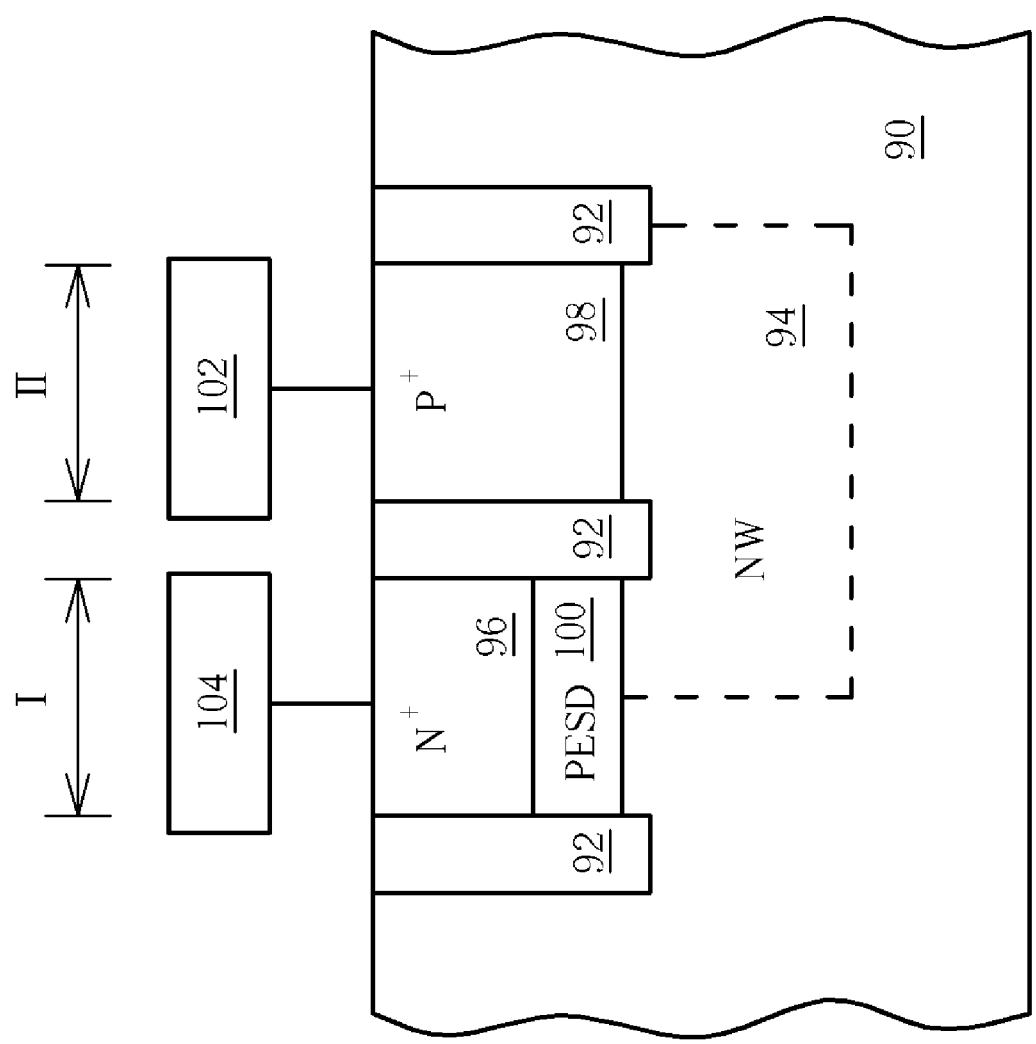
FIG. 8 is a schematic diagram illustrating an SCR device for ESD protection according to another embodiment of the present invention.

Please refer to FIG. 8. FIG. 8 is a schematic diagram illustrating an SCR device for ESD protection according to another embodiment of the present invention. As shown in FIG. 8, the SCR device for ESD protection includes a p type substrate 90, a plurality of isolation structures 92 defining a first region I and a second region II in the substrate 90, an n well 94 disposed in the substrate 90 underneath the first region I and the second region II, an n type first doped region 96 disposed in the first region I in the substrate 90, a p type second doped region 98 disposed in the second region II in the substrate 90, and a p type third doped region 100 disposed underneath the first doped region 96 in the first region I in the substrate 90.

The first doped region 96, the second doped region 98, and the third doped region 100 are heavily doped. The SCR device further includes an anode 102 electrically connected to the second doped region 98, and a cathode 104 electrically connected to the first doped region 96.

Figure 9:
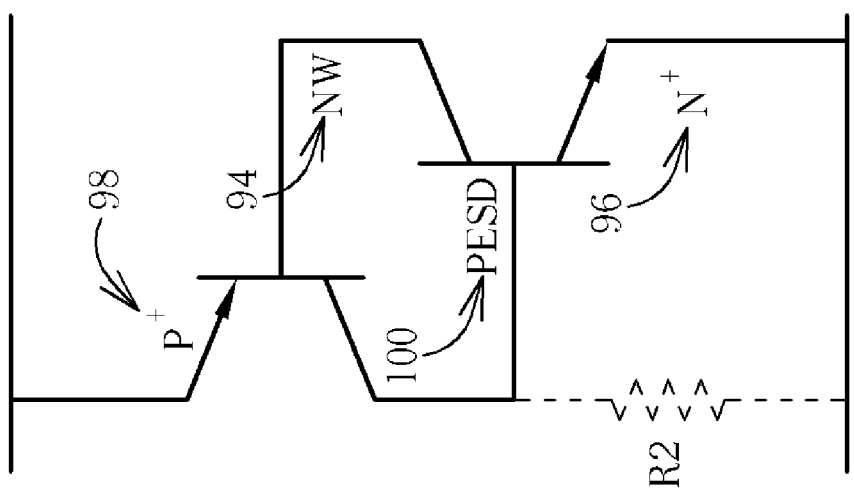
FIG. 9 illustrates an equivalent circuit of the SCR device shown in FIG. 8.

Different from the above embodiment, in this embodiment the third doped region 100 partially overlies the well 94, and partially overlies the substrate 90. Under such a condition, the third doped region 100 is coupled to the substrate 90. Please refer to FIG. 9 together with FIG. 8. FIG. 9 illustrates an equivalent circuit of the SCR device shown in FIG. 8. As shown in FIG. 9, the p type second doped region 98, the n well 94, and the p type third doped region 100 form a pnp bipolar transistor; the n well 94, the p type third doped region 100, and the n type first doped region 96 form an npn bipolar transistor. The pnp bipolar transistor and the npn bipolar transistor form a pnpn structure. It is appreciated that since the well 94 does not surround the whole bottom portion of the third doped region 100, the third doped region 100 is electrically connected to the substrate 90, thereby forming a resistor R2 (shown by dotted line).

Figure 10:
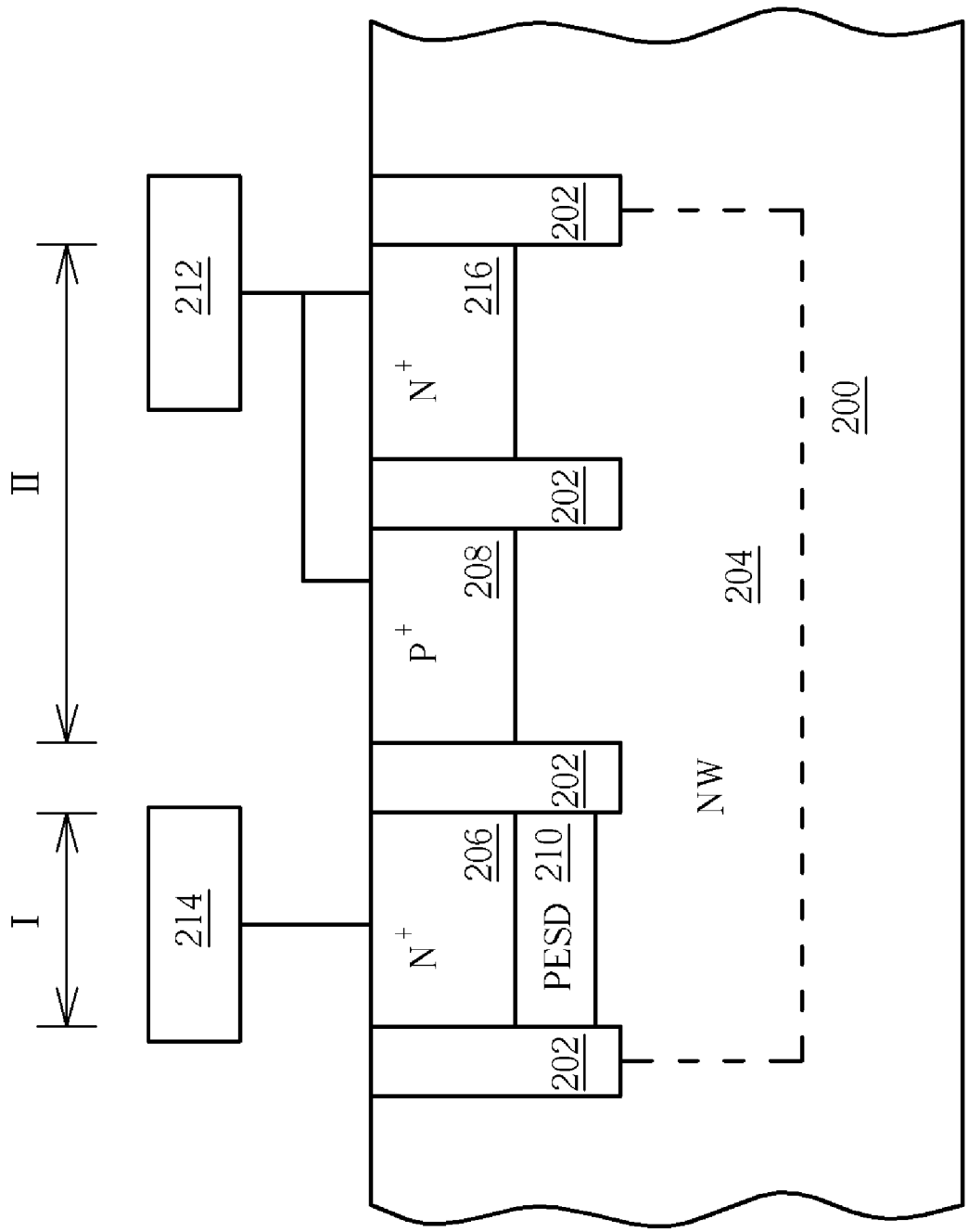
FIG. 10 is a schematic diagram illustrating an SCR device for ESD protection according to another embodiment of the present invention.

Please refer to FIG. 10. FIG. 10 is a schematic diagram illustrating an SCR device for ESD protection according to another embodiment of the present invention. As shown in FIG. 10, the SCR device for ESD protection includes a p type substrate 200, a plurality of isolation structures 202 defining a first region I and a second region II in the substrate 200, an n well 204 disposed in the substrate 200 underneath the first region I the second region II, a n type first doped region 206 disposed in the first region I in the substrate 200, a p type second doped region 208 disposed in the second region II in the substrate 200, and a p type third doped region 210 disposed underneath the first doped region 206 in the first region I in the substrate 70.

The SCR device includes an anode 212, and a cathode 214 electrically connected to the first doped region 206. Different from the embodiment of FIG. 4, the SCR device of this embodiment further includes an n type fifth doped region 216. The fifth doped region 216 and the second doped region 208 are isolated from each other in the second region II, and the second doped region 208 and the fifth doped region 216 are both electrically connected to the anode 212.

Figure 11:
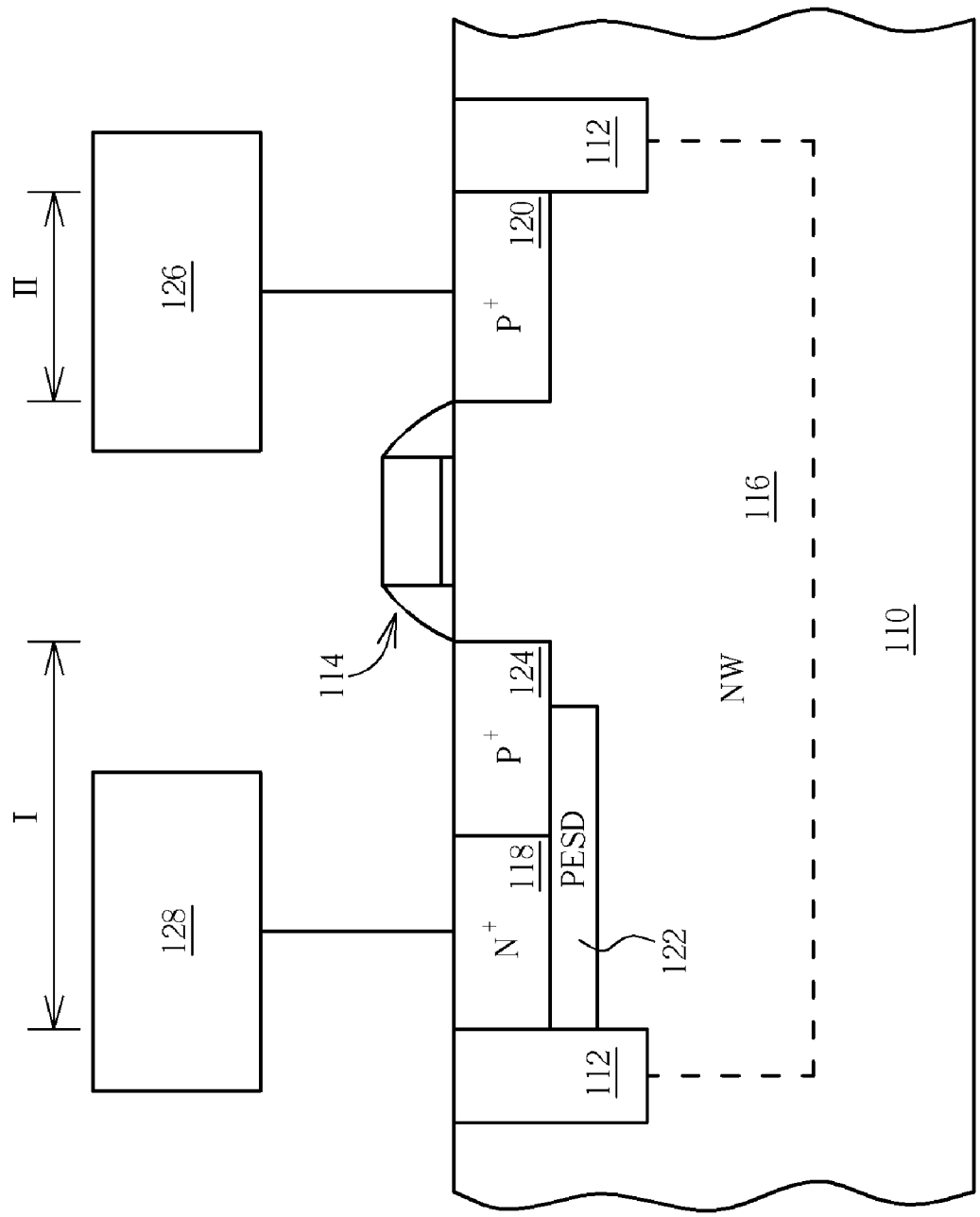
FIG. 11 is a schematic diagram illustrating an SCR device for ESD protection according to another embodiment of the present invention.

Please refer to FIG. 11. FIG. 11 is a schematic diagram illustrating an SCR device for ESD protection according to still another embodiment of the present invention. As shown in FIG. 11, the SCR device for ESD protection includes a p type substrate 110, a plurality of isolation structures 112, and a gate structure 114 disposed on the surface of the substrate 110. The gate structure 114 and the isolation structures 112 defines a first region I and a second region II in the substrate 110. The SCR device further includes an n well 116 disposed in the substrate 110 underneath the first region I and the second region II, an n type first doped region 118 disposed in the first region I in the substrate 110, a p type second doped region 120 disposed in the second region II in the substrate 110, a p type third doped region 122 disposed underneath the first doped region 118 in the first region I in the substrate 110, and a p type fourth doped region 124 disposed alongside the first doped region 118. The first doped region 118, the second doped region 120, the third doped region 122, and the fourth doped region 124 are heavily doped. The SCR device further includes an anode 126 electrically connected to the second doped region 120, and a cathode 128 electrically connected to the first doped region 118.

In this embodiment, the whole third doped region 122 is disposed over the well 116, so that the third doped region 122 is not coupled to the substrate 110. In addition, the third doped region 122 and the fourth doped region 124 surround the first doped region 118 so as to isolate the first doped region 118 from the well 116. In some applications, the gate structure 114 is turned off permanently, however, the gate structure 114 may also be electrically connected to a trigger circuit (not shown) in some applications.

Figure 12:
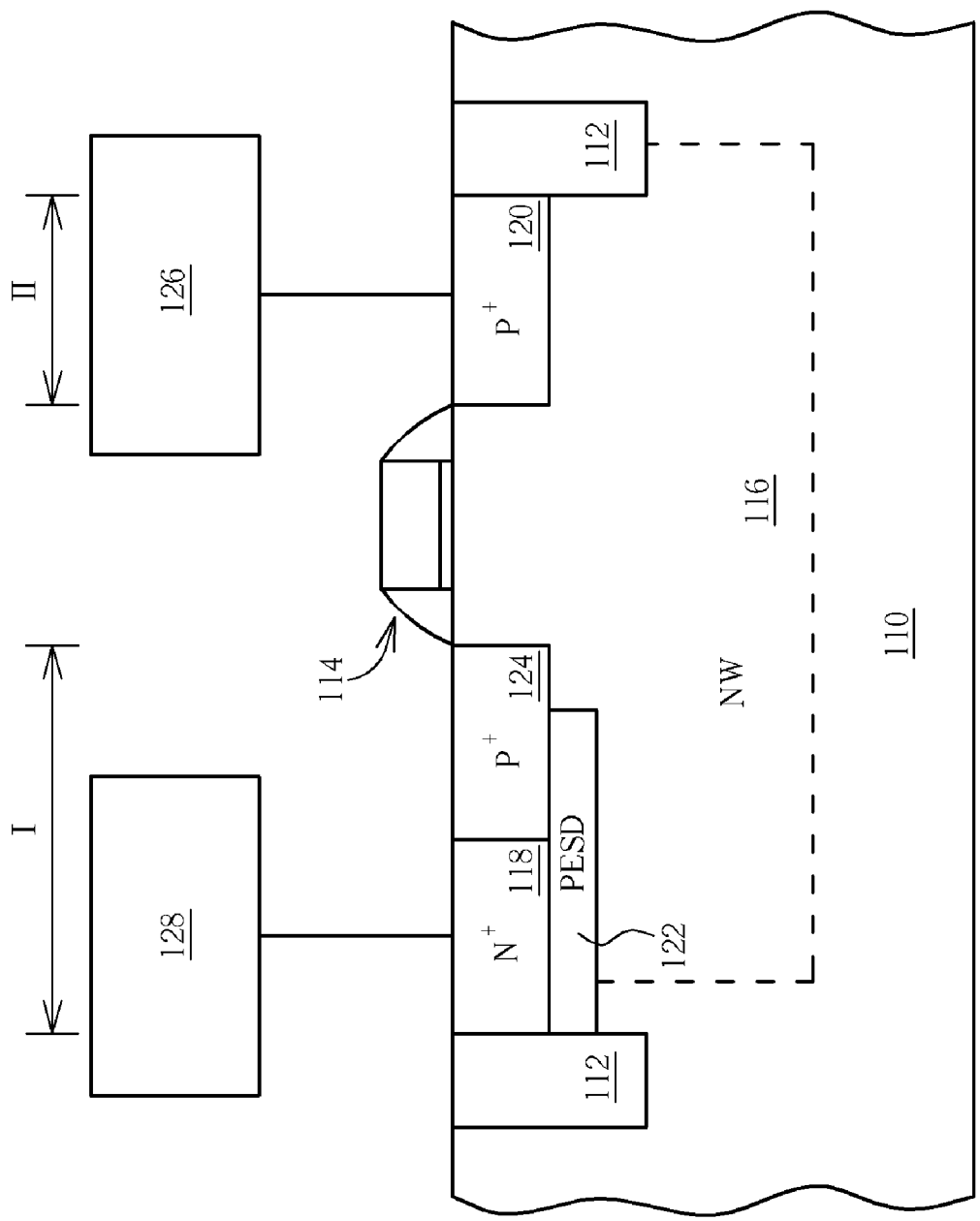
FIG. 12 is a schematic diagram illustrating an SCR device for ESD protection according to another embodiment of the present invention.

Please refer to FIG. 12. FIG. 12 is a schematic diagram illustrating an SCR device for ESD protection according to still another embodiment of the present invention. For highlighting the differences between this embodiment and the previous one, like components are denoted by like numerals, and are not redundantly described. As shown in FIG. 12, different from the SCR device of FIG. 11, the third doped region 122 partially overlies the n well 116, and partially overlies the substrate 110. Therefore, the third doped region 122 is coupled to the substrate 110.

Figure 13:
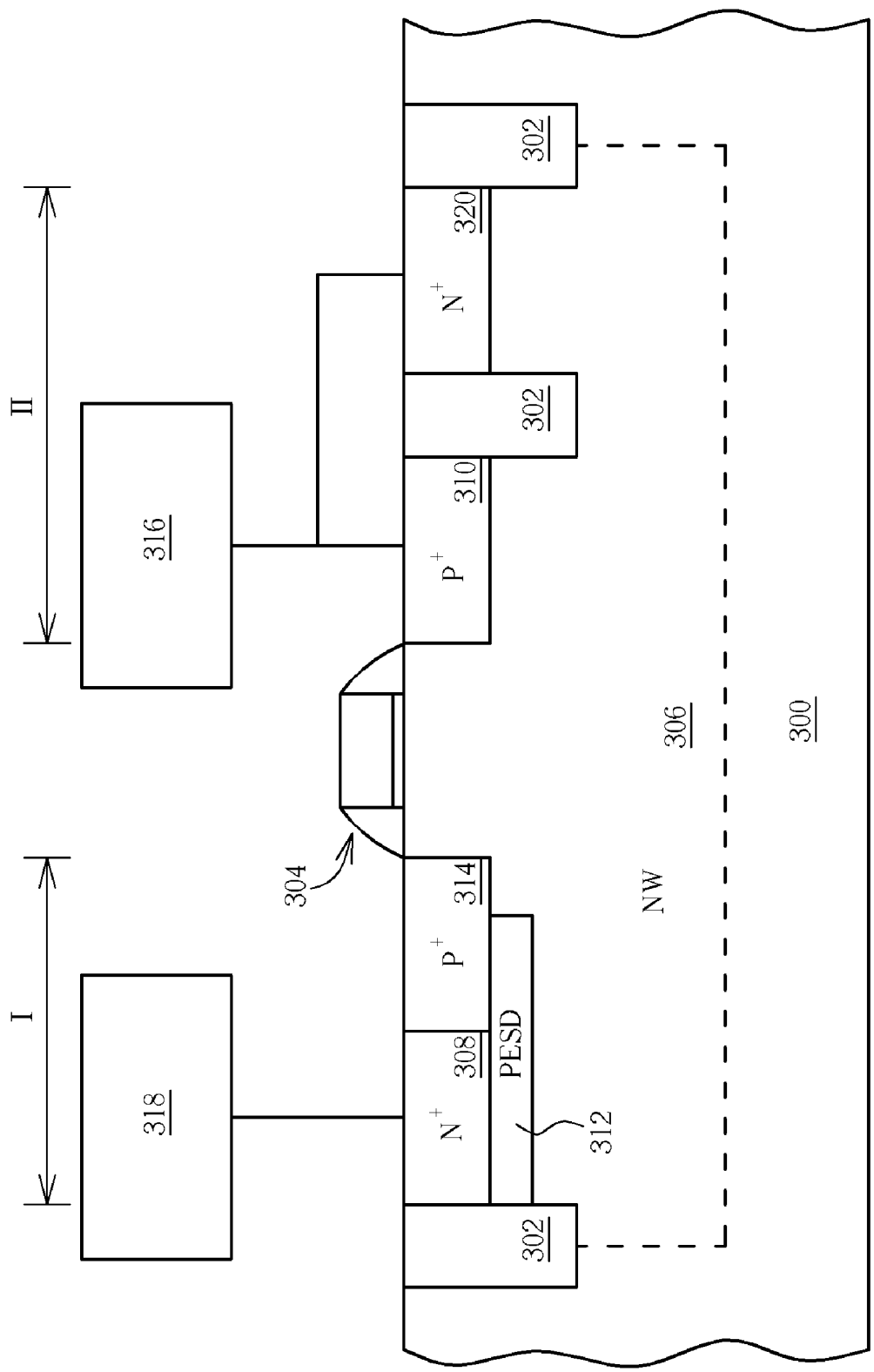
FIG. 13 is a schematic diagram illustrating an SCR device for ESD protection according to another embodiment of the present invention.

FIG. 13 is a schematic diagram illustrating an SCR device for ESD protection according to another embodiment of the present invention. As shown in FIG. 13, the SCR device for ESD protection includes a p type substrate 300, a plurality of isolation structures 302, and a gate structure 304 disposed on the surface of the substrate 300. The gate structure 304 and the isolation structures 302 defines a first region I and a second region II in the substrate 300. The SCR device further includes an n well 306 disposed in the substrate 300 underneath the first region I and the second region II, an n type first doped region 308 disposed in the first region I in the substrate 300, a p type second doped region 310 disposed in the second region II in the substrate 300, a p type third doped region 312 disposed underneath the first doped region 308 in the first region I in the substrate 300, and a p type fourth doped region 314 disposed alongside the first doped region 308. The first doped region 308, the second doped region 310, the third doped region 312, and the fourth doped region 314 are heavily doped. The SCR device further includes an anode 316, and a cathode 318 electrically connected to the first doped region 308.

In this embodiment, the whole third doped region 312 is disposed over the well 306, so that the third doped region 312 is not coupled to the substrate 300. The third doped region 312 and the fourth doped region 314 surround the first doped region 308 so as to isolate the first doped region 308 from the well 306. In some applications, the gate structure 304 is turned off permanently, however, the gate structure 304 may also be electrically connected to a trigger circuit (not shown) in some applications.

Different from the embodiment shown in FIG. 11, the SCR device further of this embodiment includes a heavily doped n type fifth doped region 320 in the second region II of the substrate 300. The fifth doped region 320 and the second doped region 310 are isolated from each other, and are both electrically connected to the anode 316.

One of the main features in common in the various SCR devices of the above embodiments is the use of the third doped region (PESD implant region). The PESD implant region is also used in other types of ESD protection devices e.g. bipolar transistor for ESD protection and MOS transistor for ESD protection. Thus, the SCR devices of the present invention are advantageous over the conventional SCR devices because no extra mask or process is required to from the PESD implant region.

Figure 14:
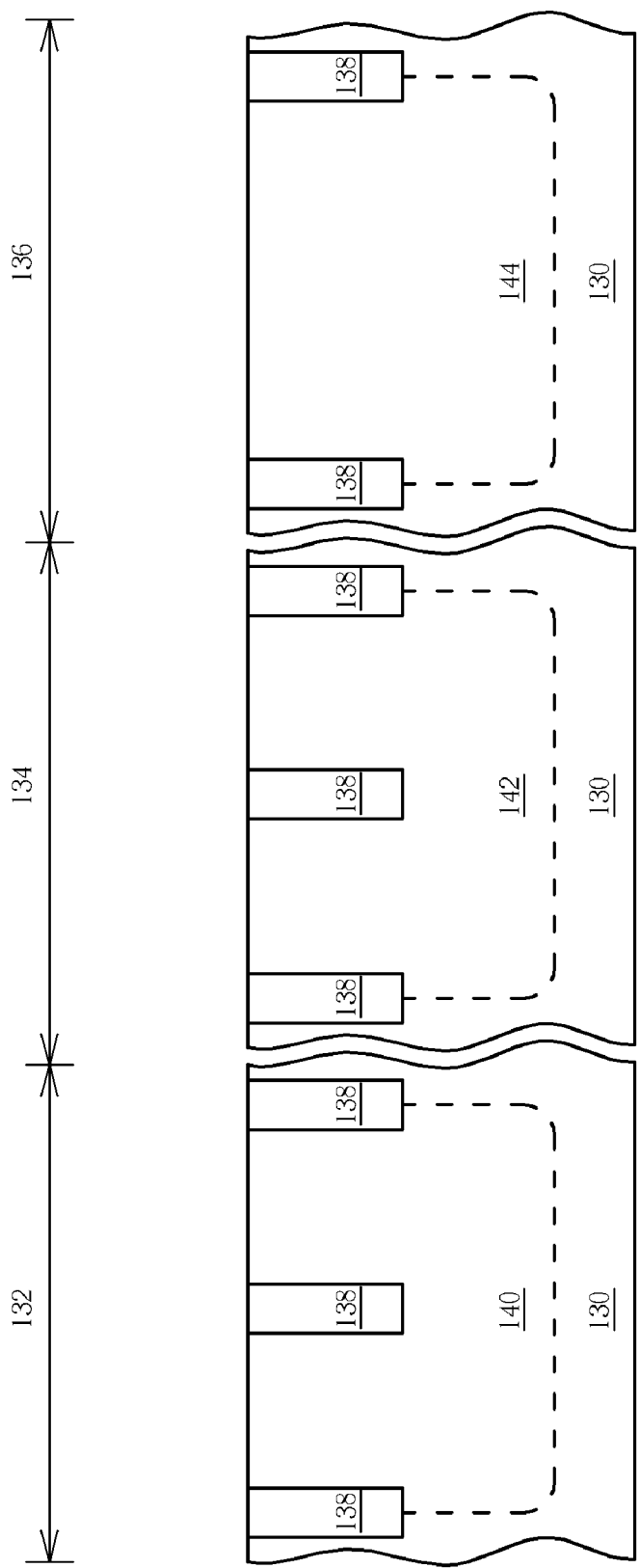
FIGS. 14-15 illustrate a method of fabricating an SCR device of the present invention.
Figure 15:
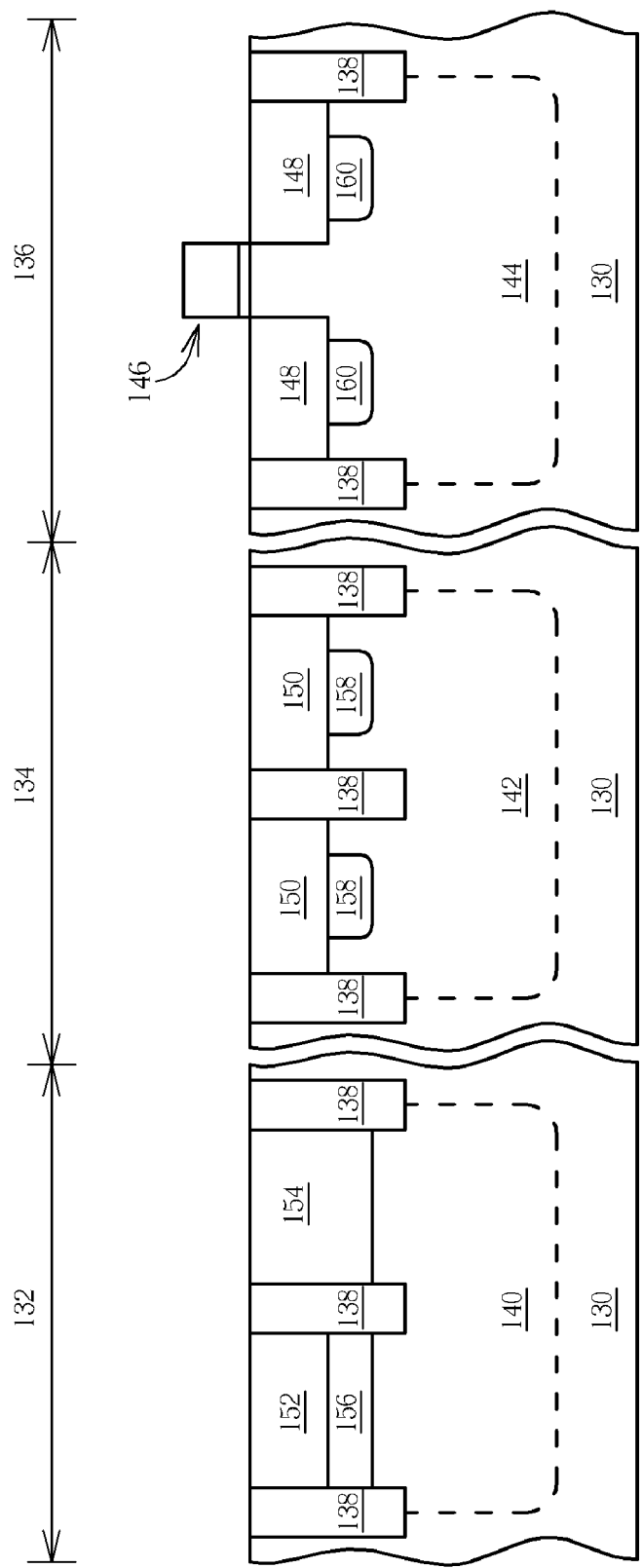

Please refer to FIGS. 14-15. FIGS. 14-15 illustrate a method of fabricating an SCR device of the present invention. This method is integrated into the process steps of forming other ESD protection devices. As shown in FIG. 14, a substrate 1 30 is provided. The substrate 130 includes an SCR device region 132, a bipolar transistor region 134, and a MOS transistor region 136. Subsequently, a plurality of STIs 138 are formed in the substrate 130 of the SCR device region 132, the bipolar transistor region 134, and the MOS transistor region 136. Then, an n well 140 is formed in the SCR device region 132, and p wells 142, 144 are formed in the bipolar transistor region 134 and in the MOS transistor region 136 of the substrate 130. It is appreciated that if the substrate 130 is a p type substrate, the p wells 142, 144 may not be required.

As shown in FIG. 15, a gate structure 146 is formed on the surface of the substrate 130 in the MOS transistor region 136. Then, an implantation process is performed to form n type doped regions 148 which serve as source/drain in the MOS transistor region 136, n type doped regions 150 in the bipolar transistor region 134, and n type doped region 152 (the first doped region) in the SCR device region 132. Also, another implantation process is performed to form a p type doped region 154 (the second doped region) in the SCR device region 132. Another implantation process is carried out to form PESD implant region 156 (the third doped region) in the SCR device region 132, and PESD implant regions 158, 160 in the bipolar transistor region 134 and in the MOS transistor region 136. These three implantation processes are required in fabricating MOS transistor and bipolar transistor for ESD protection, and the step sequences of these three implantation steps may be swapped where necessary. Since the formation of the PESD implant region 156 in the SCR device region 132 does not require extra mask or implantation process, the SCR device for ESD protection of the present invention is easy to be integrated into standard process steps of ESD protection devices.

Figure 16:
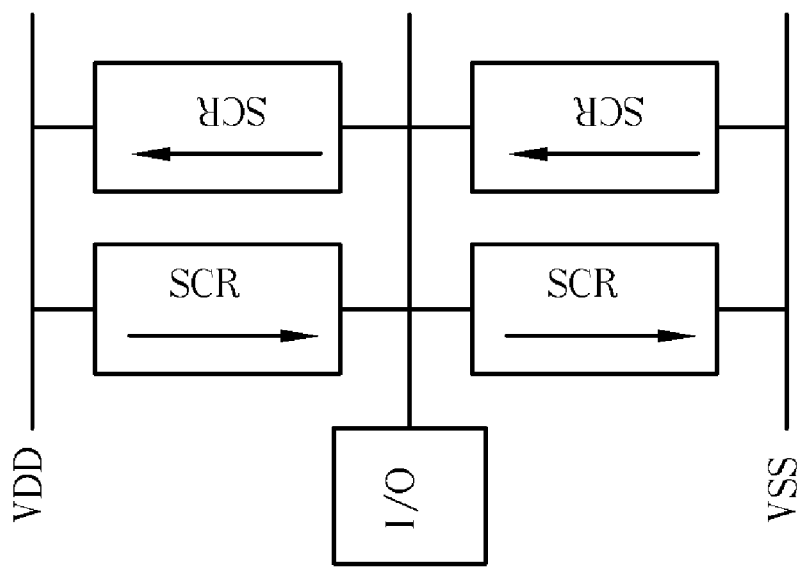
FIGS. 16-21 illustrate different applications of the SCR device of the present invention.
Figure 17:
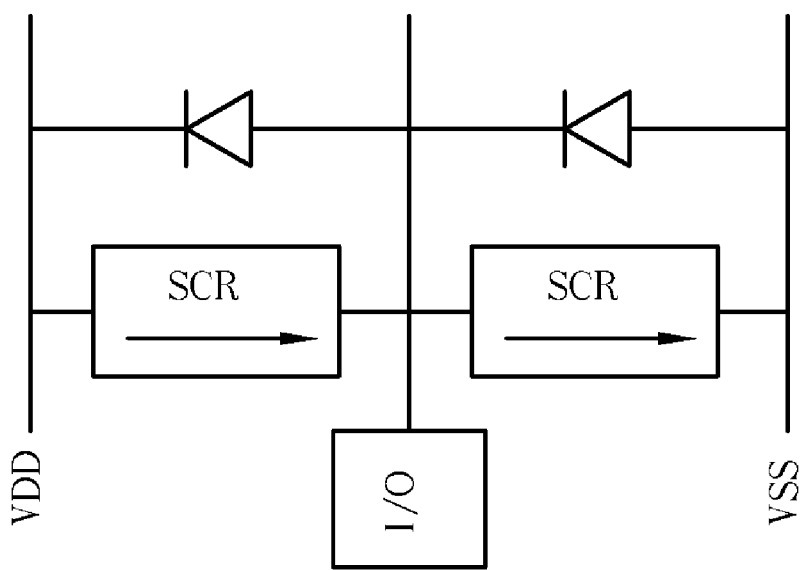
Figure 18:
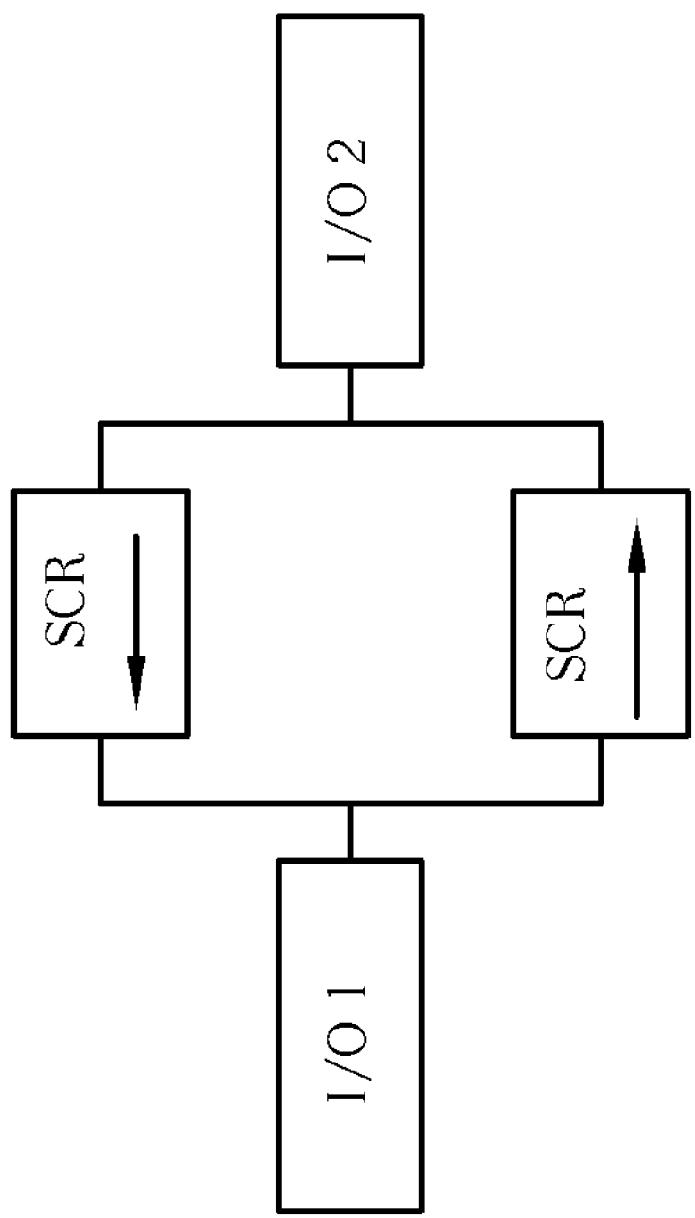
Figure 19:
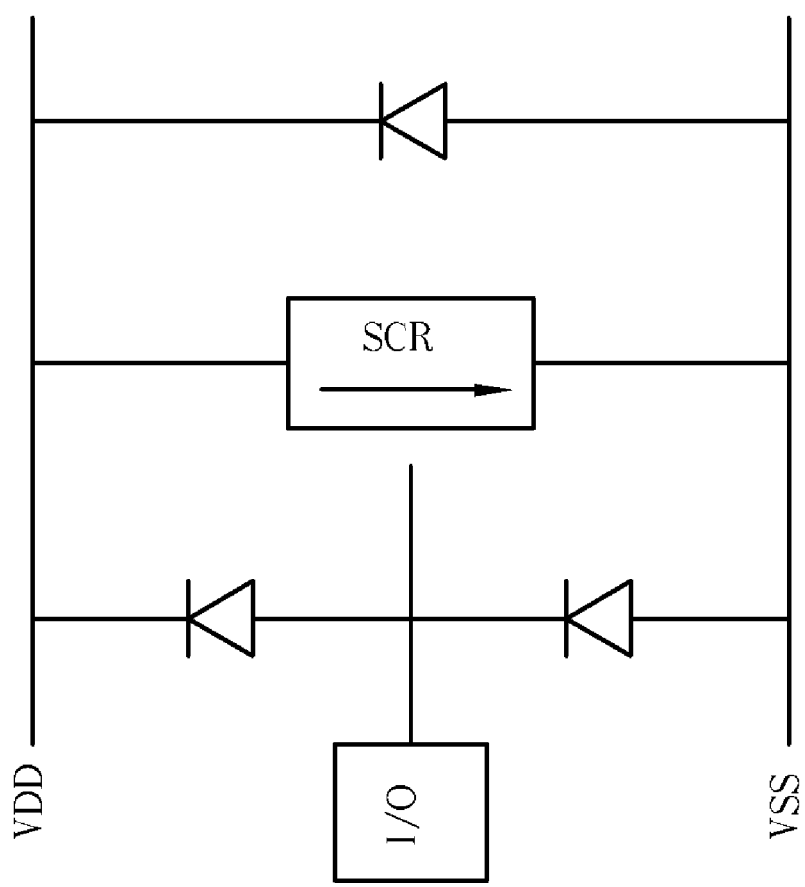
Figure 20:
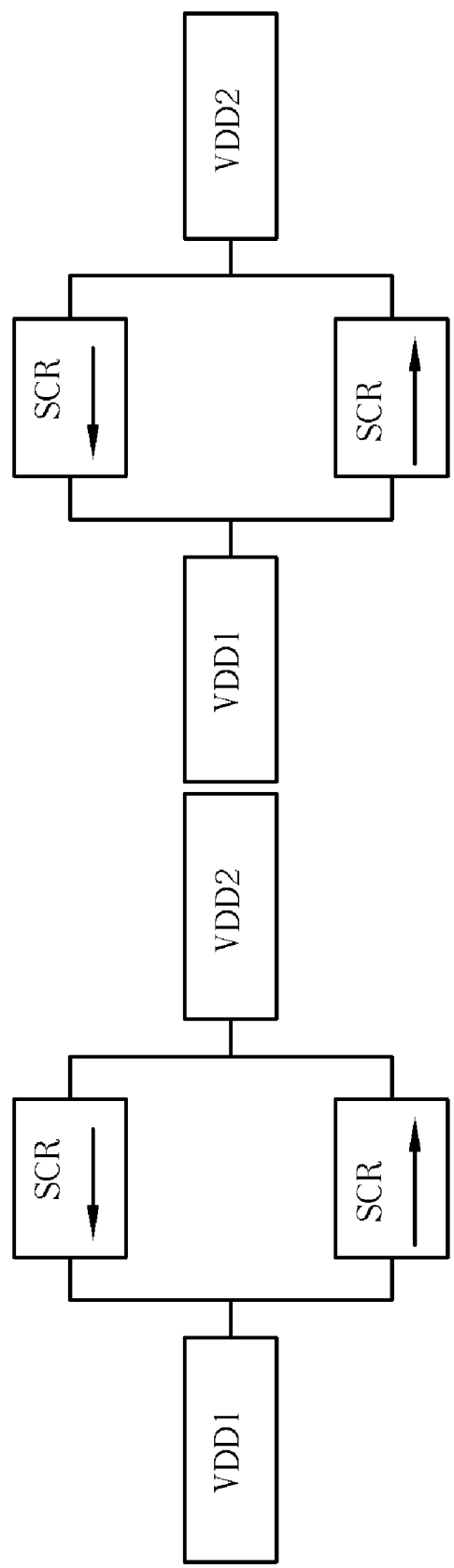
Figure 21:
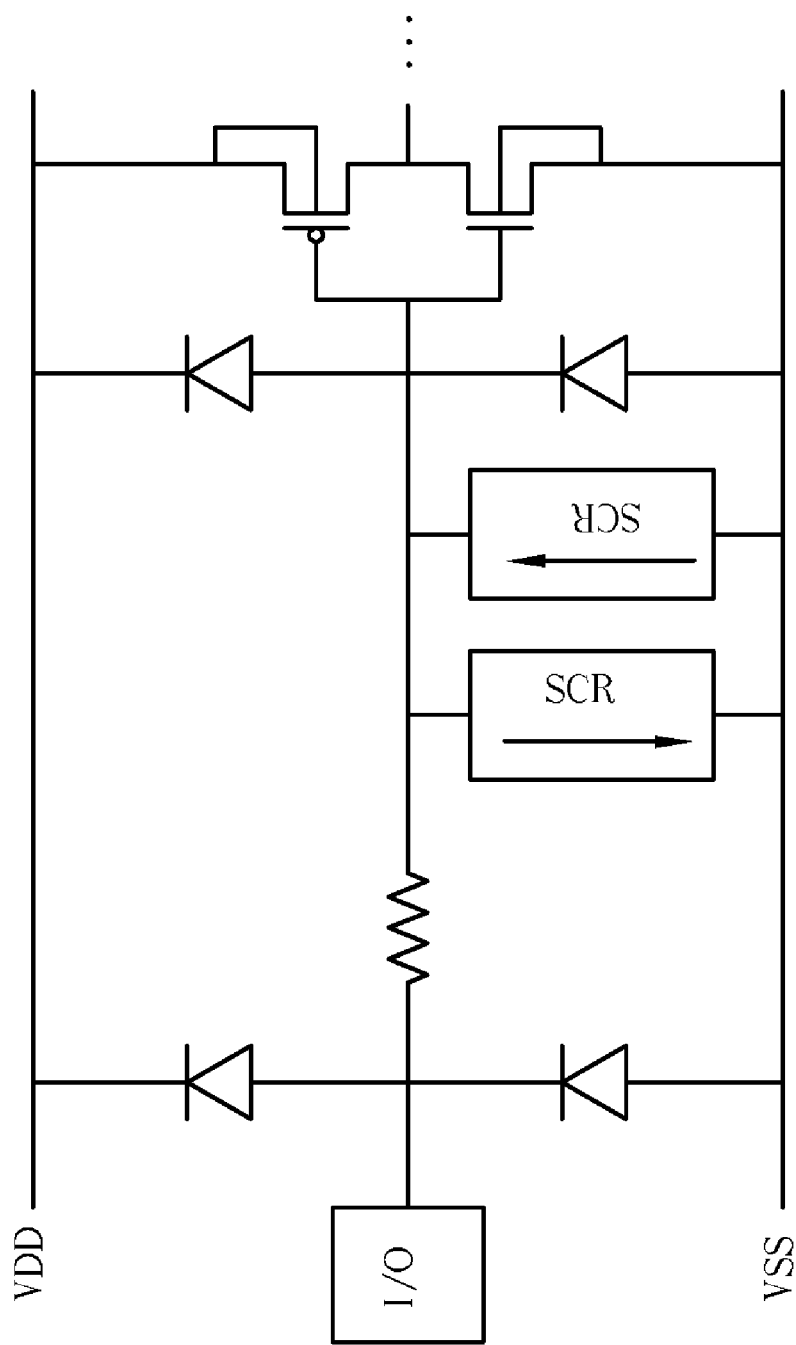

Please refer to FIGS. 16-21. FIGS. 16-21 illustrate different applications of the SCR device of the present invention. For instance, FIG. 16 depicts a hot swap I/O application. FIGS. 17-18 show other I/O applications. FIG. 19 depicts a power clamp application, and FIG. 20 shows another power domain application. FIG. 21 depicts a CDM application. The SCR device of the present invention is not limited by the above examples, and can also be in various applications.

In summary, the SCR device for ESD protection of the present invention has a reduced trigger voltage, and the trigger voltage can be fine tuned by altering the parameters of the PESD implant region. In addition, the SCR device has reduced trigger voltage, small layout area, and good compatibility.

Those skilled in the art will readily observe that numerous modifications and alterations of the device and method may be made while retaining the teachings of the invention.

What is claimed is:

1. A silicon controlled rectifier (SCR) device for electrostatic discharge (ESD) protection, comprising:
    a substrate;
    a plurality of isolation structures disposed in the substrate, the isolation structures defining a first region and a second region in the substrate;
    a well of a first conductive type disposed in the substrate, wherein the well is disposed underneath the first region and the second region;
    a first doped region of the first conductive type disposed in the first region in the substrate;
    a second doped region of a second conductive type disposed in the second region in the substrate; and
    a third doped region of the second conductive type disposed underneath the first doped region in the first region in the substrate, wherein the third doped region isolates the first doped region from the well and is in contact with said isolation structures.

2. The SCR device of claim 1, wherein the whole third doped region is disposed over the well.

3. The SCR device of claim 1, wherein the third doped region partially overlies the well, and partially overlies the substrate.

4. The SCR device of claim 1, wherein the substrate has the second conductive type.

5. The SCR device of claim 1, further comprises an anode electrically connected to the second doped region, and a cathode electrically connected to the first doped region.

6. The SCR device of claim 5, further comprising a fifth doped region of the first conductive type in the second region, the fifth doped region being electrically connected to the anode.

7. The SCR device of claim 1, wherein the first doped region is heavily doped.

8. The SCR device of claim 1, wherein the second doped region is heavily doped.

9. The SCR device of claim 1, wherein the third doped region is heavily doped.

10. A silicon controlled rectifier (SCR) electrostatic discharge (ESD) protection device, comprising:
    a substrate;
    a plurality of isolation structures disposed in the substrate;
    a gate structure disposed on the surface of the substrate, the gate structure and the isolation structures defining a first region and a second region in the substrate;
    a well of a first conductive type disposed in the substrate, wherein the well is disposed underneath the first region and the second region;
    a first doped region of the first conductive type disposed in the first region in the substrate;
    a second doped region of a second conductive type disposed in the second region in the substrate;
    a third doped region of the second conductive type disposed underneath the first doped region in the first region in the substrate; and
    a fourth doped region of the second conductive type disposed alongside the first doped region, wherein the third doped region and the fourth doped region isolate the first doped region from the well.

11. The SCR device of claim 10, wherein the whole third doped region is disposed over the well.

12. The SCR device of claim 10, wherein the third doped region partially overlies the well, and partially overlies the substrate.

13. The SCR device of claim 10, wherein the substrate has the second conductive type.

14. The SCR device of claim 10, further comprises an anode electrically connected to the second doped region, and a cathode electrically connected to the first doped region.

15. The SCR device of claim 14, further comprising a fifth doped region of the first conductive type in the second region, the fifth doped region being electrically connected to the anode.

16. The SCR device of claim 10, wherein the first doped region is heavily doped.

17. The SCR device of claim 10, wherein the second doped region is heavily doped.

18. The SCR device of claim 10, wherein the third doped region is heavily doped.

19. The SCR device of claim 10, wherein the fourth doped region is heavily doped.

* * * * *